(12) United States Patent
Luttrell

(10) Patent No.: US 7,022,439 B2
(45) Date of Patent: Apr. 4, 2006

(54) FRACTURING POLYGONS USED IN A LITHOGRAPHY PROCESS FOR FABRICATING AN INTEGRATED CIRCUIT

(75) Inventor: Bruce Luttrell, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 274 days.

(21) Appl. No.: 10/412,171

(22) Filed: Apr. 10, 2003

(65) Prior Publication Data

US 2004/0205686 A1 Oct. 14, 2004

(51) Int. Cl.
G03F 9/00 (2006.01)
G06F 17/50 (2006.01)

(52) U.S. Cl. .............. 430/5; 430/30; 716/19; 716/20; 716/21

(58) Field of Classification Search ............ 430/5, 430/30; 716/19, 20, 21
See application file for complete search history.

(56) References Cited

U.S. PATENT DOCUMENTS 5,885,734 A * 3/1999 Pierrat et al. ............... 716/19
5,943,487 A * 8/1999 Messerman et al. ......... 716/11
6,470,489 B1 * 10/2002 Chang et al. ............... 716/21

* cited by examiner

*Primary Examiner*—Christopher G. Young
(74) *Attorney, Agent, or Firm*—Park, Vaughan & Fleming LLP

(57) ABSTRACT

A system is provided for fracturing a polygon on a mask layout used in a lithographic process for manufacturing an integrated circuit. The system receives mask layouts that include polygons that may include holes with exit routes near notches either on the outside of the polygon or internal to the hole. A notch is undesirable because fracturing the polygon for printing by the lithographic equipment can create slivers that do not expose well during exposure. The system moves the exit route for a vertex trace so that the exit route passes through a vertex of the notch thereby eliminating the sliver.

21 Claims, 3 Drawing Sheets

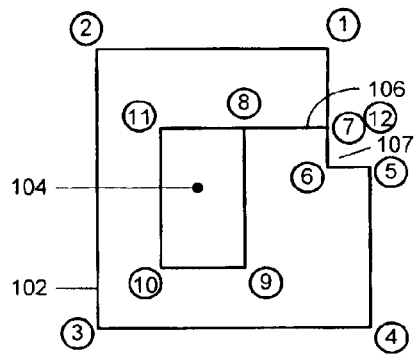
FIG. 1A
(PRIOR ART)
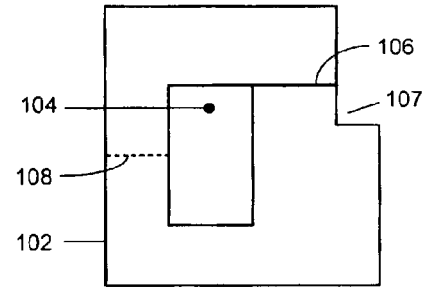
FIG. 1B
(PRIOR ART)
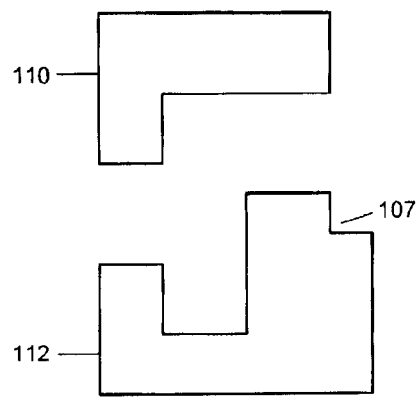
FIG. 1C
(PRIOR ART)
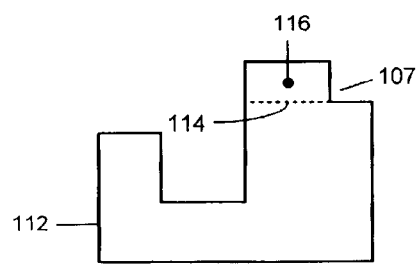
FIG. 1D
(PRIOR ART)
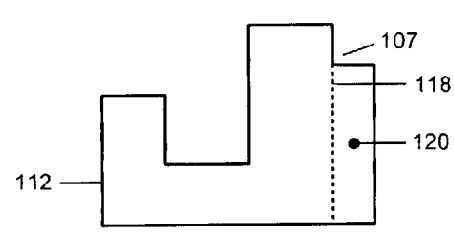
FIG. 1E
(PRIOR ART)
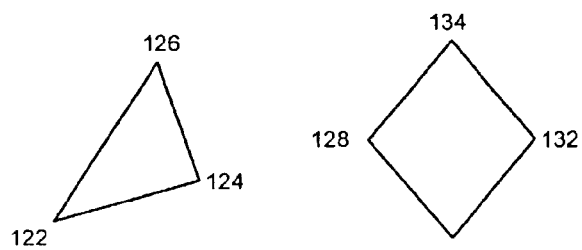
FIG. 1F
(PRIOR ART)
FIG. 1G
(PRIOR ART)

FRACTURING POLYGONS USED IN A LITHOGRAPHY PROCESS FOR FABRICATING AN INTEGRATED CIRCUIT

BACKGROUND

1. Field of the Invention

The invention relates to the process of fabricating integrated circuits. More specifically, the invention relates to a method and an apparatus for fracturing polygons used in a lithography process for fabricating integrated circuits.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process begins with the formation of a photoresist layer on the surface of a semiconductor wafer. A mask composed of opaque regions, which are generally formed of chrome, and light-transmissive clear regions, which are generally formed of quartz, is then positioned over this photoresist layer. (Note that the term "mask" as used in this specification is meant to include the term "reticle.") Light is then shone on the mask from a visible light source, an ultraviolet light source, or more generally some type of electromagnetic radiation source together with suitably adapted masks and lithography equipment.

This image is reduced and focused through an optical system containing a number of lenses, filters, and mirrors. The light passes through the clear regions of the mask and exposes the underlying photoresist layer. At the same time, opaque regions of the mask block the light leaving underlying portions of the photoresist layer unexposed.

The exposed photoresist layer is then developed, through chemical removal of either the exposed or non-exposed regions of the photoresist layer. The end result is a semiconductor wafer with a photoresist layer having a desired pattern. This pattern can then be used for etching underlying regions of the wafer.

The masks used to expose the photoresist layer are typically processed by an optical proximity correction (OPC) process to alleviate problems cause by the diffraction of the radiation at the feature edges, and the over-etching of the photoresist at the ends of the features. After the OPC process, the mask features are often fractured so that each exposure element is a rectangle or a trapezoid. This fracturing process can lead to problems when a feature on the mask includes a notch near a hole.

For example, FIG. 1A illustrates a mask feature 102 with a notch 107 near a hole 104. Note that feature 102 includes "hole route" 106, which allows a vertex trace to enter and exit the hole 104 in feature 102. A polygon can be represented by a vertex trace, which traverses the polygon edges in a counterclockwise fashion. In FIG. 1A, for example, a vertex trace can start at the upper right vertex labeled 1 and proceed counterclockwise to the upper left vertex labeled 2 then to lower left vertex labeled 3 and so on. The trace terminates when it reaches the point preceding the initial point. Note that while a counterclockwise vertex trace is described, a clockwise vertex trace would work as well.

When the trace enters a hole, the hole is traced in a clockwise fashion. Note that this is consistent with the counterclockwise trace on the outside of the polygon because it keeps the polygon interior to the left of the trace. In FIG. 1A, the entrance to the hole is from the vertex at the right end of hole route 106 (vertex 7). The next vertex, vertex 8, is at the upper right of the hole. Note that the exit vertex, vertex 12, is at the same point as vertex 7.

During the mask writing process, in order to simplify the polygon, it is desirable to eliminate such holes. This is typically accomplished by making a cut on the polygon. For example, FIG. 1B illustrates how cut 108 is added to feature 102 to divide feature 102 into an upper portion 110 and a lower portion 112 as is illustrated in FIG. 1C—drawn exploded apart for clarity. The fracturing process then continues to make additional cuts to fracture the polygons for the upper portion 110 and lower portion 112 into rectangles and trapezoids.

FIG. 1D illustrates how a sliver 116 is generated in the lower portion 112 of feature 102. If the fracturing process places cut 114 at the vertex of notch 107 as shown, sliver 116 is created. Note that the width of sliver 116 may be smaller than a minimum sliver width, which may cause problems during subsequent mask writing and fabrication operations.

A sliver is a rectangle or a trapezoid whose minimum width is below a user-defined threshold. The polygon-fracturing algorithm targets "shaped beam" electron photolithography, where the mask is exposed by photographic equipment, which directs the beam through a keyhole aperture. If this aperture is too narrow, the exposure will be less successful than normal. Machine parameters dictate what this minimum aperture width is; any shape which falls below this minimum aperture width is termed a "sliver."

FIG. 1E illustrates another possibility for fracturing the lower portion 112 of mask feature 102. In an alternate attempt to fracture the polygon into rectangles, the fracturing process places cut 118 at the vertex of notch 107 as shown, creating sliver 120. The width of sliver 120 may also be smaller than a minimum sliver width, and may also cause problems during subsequent mask writing and fabrication operations. Note that while the above discussion relates to photo mask writing systems, the same problems of creating slivers can exist in direct write lithography systems also.

Hence, what is needed is a method and an apparatus for fracturing polygons on a mask used in an optical lithographic process without the problems described above.

SUMMARY

One embodiment of the invention provides a system for fracturing a polygon on a mask layout used in a lithographic process for manufacturing an integrated circuit. The system operates by first receiving the mask layout that includes the polygon. The system then examines the polygon to determine if the polygon includes a hole next to a notch. If so, the system moves an exit route from the hole so that a resulting fracturing of the polygon does not create a sliver with a width less than a pre-specified minimum size.

In a variation on this embodiment, moving the exit route from the hole involves moving the exit route so that a vertex trace for the polygon can be routed into the hole and out of the hole at a vertex associated with the notch.

In one embodiment of the present invention, the notch is located at either an exterior of the polygon or an interior of the hole.

In a variation of this embodiment, determining if the polygon includes the hole exit route next to the notch involves first locating an inner corner that forms on the polygon, and then determining if the inner corner is within a pre-specified distance of the exit route of a vertex trace into and out of the hole.

In a further variation, if the polygon includes a hole exit route next to a notch, the method further comprises moving the exit route used by a vertex trace to enter and exit the hole so that the exit route intersects a vertex associated with the notch.

In a further variation, moving the exit route used by a vertex trace involves altering the exit route to create a new route at the notch.

In a further variation, the lithographic process includes a direct write process onto a wafer.

BRIEF DESCRIPTION OF THE FIGURES

FIG. 1A illustrates a mask feature with a hole near a notch.

FIG. 1B illustrates the mask feature of FIG. 1A with cuts to eliminate the hole near the notch.

FIG. 1C illustrates the two subpolygons, which result from initial cut 108 in FIG. 1B.

FIG. 1D illustrates a sliver on the lower portion of the mask feature of FIG. 1A.

FIG. 1E illustrates another sliver on the lower portion of the mask feature of FIG. 1A.

FIG. 1F illustrates a triangle that cannot be printed by an electron beam machine.

FIG. 1G illustrates a parallelogram or rhombus that cannot be printed by an electron beam machine.

DEFINITIONS

Figure 2A:
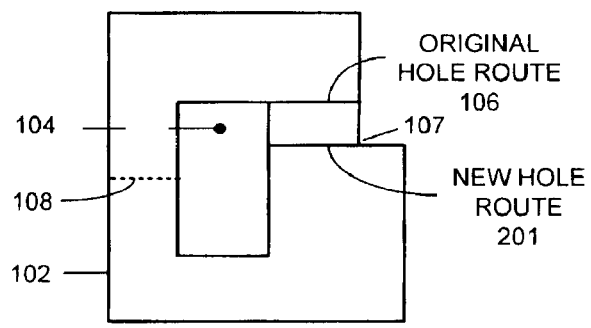
FIG. 2A illustrates modifying a polygon's vertex trace to change the "hole route" in order to eliminate a notch in accordance with an embodiment of the invention.

Initial Hole Route: the initial route out of a hole in a feature that is formed by projecting a horizontal line to the right from the top right corner of the hole. The vertices immediately beneath this horizontal line may be a notch vertex.

Notch Vertex: any vertex whose distance to the two neighboring vertices, both horizontally and vertically, is less than the defined sliver width.

Sliver: a rectangle or a trapezoid whose minimum width is below a user-defined threshold.

OVERVIEW

This application describes a technique, which is a small part of the polygon fracturing module in CATS™ software from Synopsys, Inc., Mountain View, Calif. However, the technique can be applied to any polygon fracturing software that is used to fracture polygons for exposure by lithographic equipment. The following terms tend to be used interchangeably within this application: polygon, feature, shape, and geometry. However, the term polygon specifically describes a geometry of three or more vertices, which is neither a rectangle with horizontal and vertical edges, nor a triangle with at least one horizontal or vertical edge, nor a trapezoid with either two horizontal or two vertical edges. In other words, a geometry, which has to be further decomposed to fit the requirements of electron beam machines that can expose only these shapes.

FIG. 1F illustrates a triangle that cannot be printed by an electron beam machine. The three edges are "angled edges" in that they are neither horizontal nor vertical. Hence, even though the shape is a triangle, and therefore a trapezoid, it is not possible for an electron beam machine to expose it because none of the three edges is horizontal or vertical. This triangle must be fractured in one of two ways: either a horizontal line must be extended from vertex 124 to the line segment between vertex 122 and vertex 126, or a vertical line must be extended from vertex 126 to the line segment between vertex 122 and vertex 124.

FIG. 1G illustrates a parallelogram or rhombus that cannot be printed by an electron beam machine. None of the four edges of this trapezoid is horizontal or vertical; hence the trapezoid must be fractured by either extending a horizontal line between vertex 128 and vertex 132, or by extending a vertical line between vertex 134 and vertex 130.

DETAILED DESCRIPTION

Fractured Polygons

FIG. 2A illustrates the process of modifying a polygon's vertex trace, by changing the "hole route" in order to eliminate a notch 107 in accordance with an embodiment of the invention. During operation, the system examines feature 102 to locate a vertex of a notch 107 near hole 104 in feature 102. Next, the system moves the original "hole route" 106 to become new "hole route" 201 at the vertex of the notch. The system then creates cut 108 to eliminate the hole by separating feature 102 into an upper portion 202 and a lower portion 204, shown exploded in FIG. 2B.

Figure 2B:
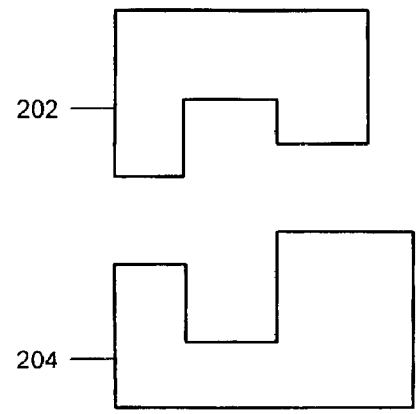
FIG. 2B illustrates resulting portions of the polygon in accordance with an embodiment of the invention.

FIG. 2B illustrates upper portion 202 and lower portion 204 of feature 102 in accordance with an embodiment of the invention. Note that unlike the upper and lower portions of the example illustrated in FIG. 1C, neither upper portion 202 nor lower portion 204 of feature 102 includes a notch where a sliver can form.

Figure 2C:
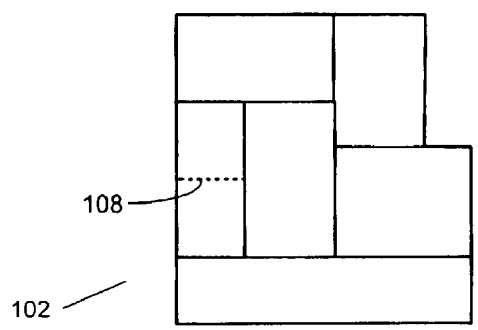
FIG. 2C illustrates the final result of fracturing a polygon in accordance with an embodiment of the invention.

FIG. 2C illustrates the final result of fracturing a polygon in accordance with an embodiment of the invention. The polygon is fractured so that each portion of the polygon is either a rectangle or a trapezoid. Note that cut 108 can optionally be removed by a process known as "healing." For example, the CATS™ software from Synopsys, Inc., Mountain View, Calif., supports healing as an optional user controllable configuration.

Fracturing a Polygon

Figure 3:
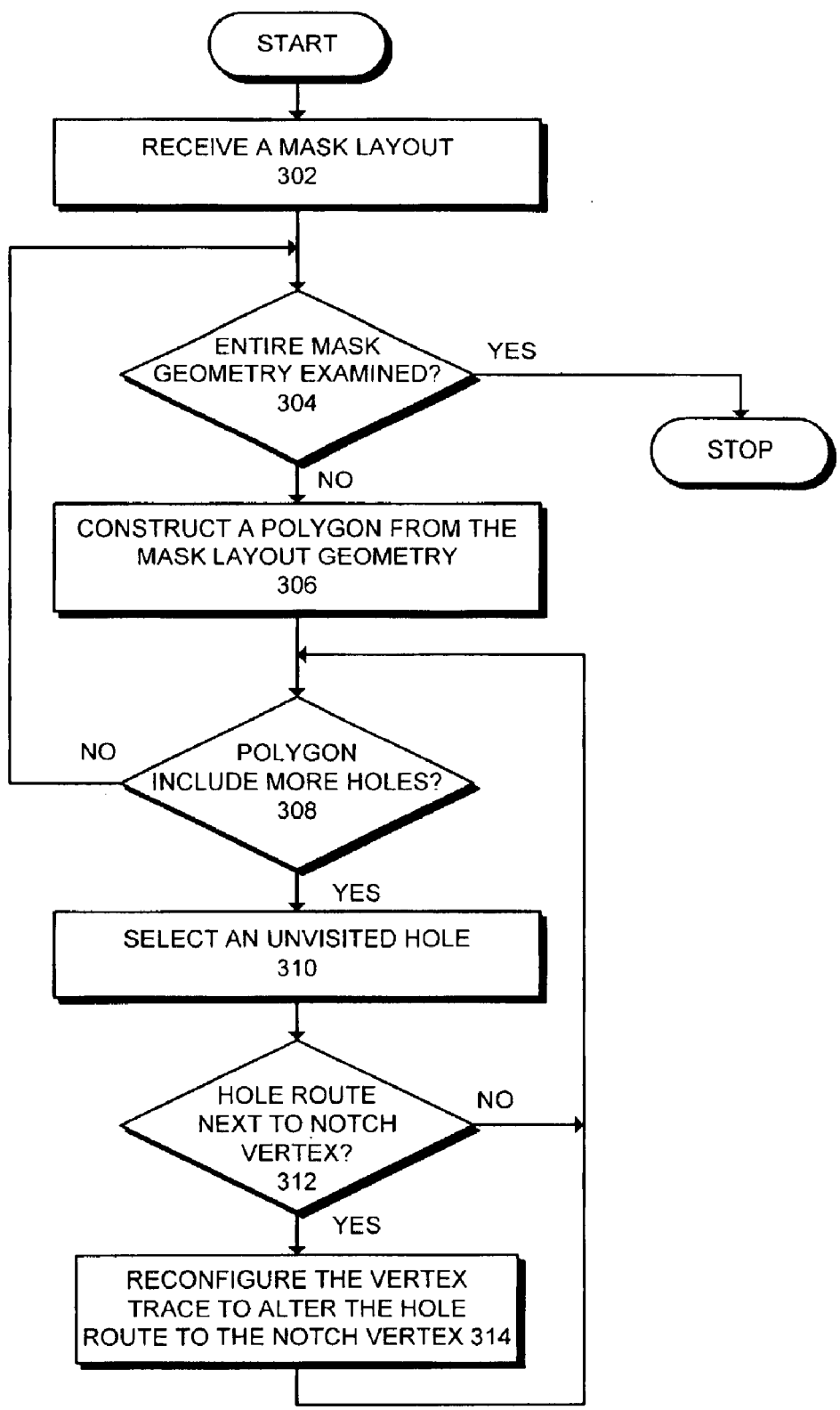
FIG. 3 presents a flowchart illustrating the process of fracturing a polygon in accordance with an embodiment of the invention.

FIG. 3 presents a flowchart illustrating the process of fracturing a polygon in accordance with an embodiment of the invention. The system starts when a mask is received (step 302). Next, the system determines if the entire mask geometry has been examined (step 304). If so, the process is terminated.

If the entire mask geometry has not been examined, the system constructs a polygon from the mask layout geometry (step 306). The system then determines if the polygon includes a hole (step 308). If not, the process returns to step 304 to continue examining the mask geometry.

If the polygon includes an unvisited hole, the system selects an unvisited hole (step 310). Next, the system determines if the hole route out of the hole is next to a notch vertex (step 312). If not, the process returns to step 308 to continue examining holes. If the hole route out of the hole is next to a notch vertex, the system reconfigures the vertex trace to alter the hole route to the notch vertex (step 314). After reconfiguring the vertex trace, the process returns to step 308 to continue examining holes.

CONCLUSION

The foregoing description is presented to enable one to make and use the invention, and is provided in the context of a particular application and its requirements. It is not intended to be exhaustive or to limit the invention to the forms disclosed. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein. Accordingly, many modifications and variations will be apparent. The scope of the invention is defined by the appended claims.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. In some embodiments, suitably modified versions of the CATS™ software that support the process of FIG. 3A are accessed across a network to perform fracturing of data for use in a mask writer and/or a direct write lithography system.

Note that the invention can be applied to any type of lithographic process for fabricating semiconductor chips, including processes that make use of, deep-ultraviolet (DUV) radiation, extreme ultraviolet (EUV) radiation, X-rays, and electron beams, along with suitably modified masks.

What is claimed is:

1. A method for fracturing a polygon on a mask layout used in a lithographic process for manufacturing an integrated circuit, comprising:
   receiving the mask layout, wherein geometry from the mask layout includes the polygon;
   examining the polygon to determine if the polygon includes a hole exit route next to a notch; and
   if so, moving an exit route from the hole so that a resulting fracturing of the polygon does not create a sliver with a width less than a pre-specified minimum size.

2. The method of claim 1, wherein moving the exit route from the hole involves moving the exit route so that a vertex trace for the polygon can be routed into the hole and out of the hole at a vertex associated with the notch.

3. The method of claim 2, wherein the notch is located at either an exterior of the polygon or an interior of the hole.

4. The method of claim 1, wherein determining if the polygon includes the hole next to the notch involves:
   locating an inner corner that forms on the polygon; and
   determining if the inner corner is within a pre-specified distance of the exit route of a vertex trace into and out of the hole.

5. The method of claim 1, wherein if the polygon includes the hole next to the notch, the method further comprises moving the exit route used by a vertex trace to enter and exit the hole so that the exit route intersects a vertex associated with the notch.

6. The method of claim 1, wherein moving the exit route used by a vertex trace involves altering the exit route to create a new route at the notch.

7. The method of claim 1, wherein the lithographic process includes a direct write process onto a wafer.

8. A computer-readable storage medium storing instructions that when executed by a computer cause the computer to perform a method for fracturing a polygon on a mask layout used in a lithographic process for manufacturing an integrated circuit, wherein the computer-readable storage medium includes an electromagnetic waveform, the method comprising:
   receiving the mask layout, wherein geometry from the mask layout includes the polygon;
   examining the polygon to determine if the polygon includes a hole next to a notch; and
   if so, moving an exit route from the hole so that a resulting fracturing of the polygon does not create a sliver with a width less than a pre-specified minimum size.

9. The computer-readable storage medium of claim 8, wherein moving the exit route from the hole involves moving the exit route so that a vertex trace for the polygon can be routed into the hole and out of the hole at a vertex associated with the notch.

10. The computer-readable storage medium of claim 9, wherein the notch is located at either an exterior of the polygon or an interior of the hole.

11. The computer-readable storage medium of claim 8, wherein determining if the polygon includes the hole next to the notch involves:
    locating an inner corner that forms on the polygon; and
    determining if the inner corner is within a pre-specified distance of the exit route of a vertex trace into and out of the hole.

12. The computer-readable storage medium of claim 8, wherein if the polygon includes the hole next to the notch, the method further comprises moving the exit route used by a vertex trace to enter and exit the hole so that the exit route intersects a vertex associated with the notch.

13. The computer-readable storage medium of claim 8, wherein moving the exit route used by a vertex trace involves altering the exit route to create a new route at the notch.

14. The computer-readable storage medium of claim 8, wherein the lithographic process includes a direct write process onto a wafer.

15. A mask having structures that were fractured according to a technique used in a lithographic process for manufacturing an integrated circuit,
    wherein the mask includes a polygon;
    wherein the polygon includes a hole;
    wherein the hole exit route is next to a notch; and
    wherein an exit route from the hole has been moved so that a sliver has not been created with a width less than a pre-specified minimum size.

16. The mask of claim 15, wherein the exit route from the hole has been moved so that a vertex trace for the polygon can be routed into the hole and out of the hole at a vertex associated with the notch.

17. The mask of claim 16, wherein the notch is located at either an exterior of the polygon or an interior of the hole.

18. The mask of claim 15, wherein the notch is within a pre-specified distance of the exit route of a vertex trace into and out of the hole.

19. The mask of claim 15, wherein the exit route from the hole has been moved so that the exit route intersects a vertex associated with the notch.

20. The mask of claim 15, wherein the exit route used by a vertex trace has been altered to create a new route at the notch.

21. The mask of claim 15, wherein the lithographic process includes a direct write process onto a wafer.

* * * * *